(12) United States Patent
Goward

(10) Patent No.: US 10,658,349 B1
(45) Date of Patent: May 19, 2020

(54) INTERCONNECT USING EMBEDDED CARBON NANOFIBERS

(71) Applicant: Facebook Technologies, LLC, Menlo Park, CA (US)

(72) Inventor: John Michael Goward, Ayr (GB)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/129,612

(22) Filed: Sep. 12, 2018

Related U.S. Application Data

(60) Provisional application No. 62/622,675, filed on Jan. 26, 2018.

(51) Int. Cl.
*H01L 25/16* (2006.01)
*H01L 23/00* (2006.01)
*H01L 33/62* (2010.01)

(52) U.S. Cl.
CPC ............ *H01L 25/167* (2013.01); *H01L 24/05* (2013.01); *H01L 24/13* (2013.01); *H01L 24/16* (2013.01); *H01L 24/81* (2013.01); *H01L 33/62* (2013.01); *H01L 2224/0401* (2013.01); *H01L 2224/0516* (2013.01); *H01L 2224/05017* (2013.01); *H01L 2224/05155* (2013.01); *H01L 2224/05157* (2013.01); *H01L 2224/05193* (2013.01); *H01L 2224/13026* (2013.01); *H01L 2224/13144* (2013.01); *H01L 2224/16148* (2013.01); *H01L 2224/8112* (2013.01); *H01L 2224/81201* (2013.01); *H01L 2924/1033* (2013.01); *H01L 2924/10253* (2013.01); *H01L 2924/12041* (2013.01); *H01L 2924/1426* (2013.01); *H01L 2933/0066* (2013.01)

(58) Field of Classification Search
CPC ....... H01L 25/167; H01L 24/13; H01L 24/16; H01L 24/81; H01L 33/62; H01L 24/05; H01L 2933/0066; H01L 24/1033; H01L 2924/1033; H01L 2924/10253; H01L 2924/1426; H01L 2224/0401; H01L 2224/05017; H01L 2224/05193; H01L 2224/0516; H01L 2224/05155; H01L 2224/05157; H01L 2224/13026; H01L 2224/13144; H01L 2224/16148; H01L 2224/8112; H01L 2224/81201
USPC .......................................................... 257/99
See application file for complete search history.

(56) References Cited

U.S. PATENT DOCUMENTS

| 7,341,774 | B2 * | 3/2008 | Kalkan | ................. | B82Y 10/00 |
| | | | | | 428/119 |
| 8,038,887 | B2 * | 10/2011 | Bakajin | ............... | B01D 53/228 |
| | | | | | 210/652 |
| 8,426,728 | B2 * | 4/2013 | Zhao | .................. | H01L 51/4226 |
| | | | | | 136/260 |

(Continued)

*Primary Examiner* — Alexander O Williams
(74) *Attorney, Agent, or Firm* — Fenwick & West LLP

(57) ABSTRACT

Embodiments relate to the design of a device capable of increasing the electrical performance of an interconnect feature by amplifying the current carrying capacity of an interconnect feature. The device comprises a first body comprising a first surface with at least one nanoporous conductive structure protruding from the first surface. The device further comprises a second body comprising a second surface with arrays of nanofibers extending from the second surface and penetrating into corresponding nanoporous conductive structures to form conductive pathways between the first body and the second body.

20 Claims, 5 Drawing Sheets

(56) References Cited

U.S. PATENT DOCUMENTS

| | | | | |
|---|---|---|---|---|
| 9,487,877 B2* | 11/2016 | Franklin | ................ | B82Y 10/00 |
| 2004/0012913 A1* | 1/2004 | Andelman | ............ | C02F 1/4691 |
| | | | | 361/503 |
| 2004/0173506 A1* | 9/2004 | Doktycz | ............ | B01D 67/0072 |
| | | | | 210/85 |
| 2007/0108068 A1* | 5/2007 | Suh | ........................ | B82Y 30/00 |
| | | | | 205/766 |
| 2009/0082216 A1* | 3/2009 | Cohn | .................... | B82Y 40/00 |
| | | | | 506/9 |
| 2009/0220561 A1* | 9/2009 | Jin | ........................ | A61K 9/0009 |
| | | | | 424/423 |
| 2009/0273106 A1* | 11/2009 | Lin | ........................ | C04B 35/524 |
| | | | | 264/29.5 |
| 2010/0236596 A1* | 9/2010 | Lee | ........................ | B82Y 30/00 |
| | | | | 136/230 |
| 2010/0303722 A1* | 12/2010 | Jin | .......................... | A61L 27/30 |
| | | | | 424/9.1 |
| 2011/0189510 A1* | 8/2011 | Caracciolo | .......... | H01M 4/0421 |
| | | | | 429/50 |
| 2013/0309484 A1* | 11/2013 | Sailor | ...................... | D01D 5/00 |
| | | | | 428/320.2 |
| 2014/0079921 A1* | 3/2014 | De Volder | ............. | B82Y 30/00 |
| | | | | 428/196 |
| 2014/0147627 A1* | 5/2014 | Aizenberg | .............. | A61L 15/24 |
| | | | | 428/141 |
| 2015/0236367 A1* | 8/2015 | Kim | .................... | H01M 8/1023 |
| | | | | 429/482 |
| 2018/0104972 A1* | 4/2018 | Hart | ........................ | B41K 3/56 |
| 2018/0277314 A1* | 9/2018 | Dunn | .................... | H01G 11/26 |
| 2019/0148321 A1* | 5/2019 | Chaji | .................... | H01L 24/27 |
| | | | | 438/57 |
| 2019/0237420 A1* | 8/2019 | Goward | .................. | H01L 24/11 |

* cited by examiner

INTERCONNECT USING EMBEDDED CARBON NANOFIBERS

CROSS-REFERENCE TO RELATED APPLICATION

This application claims priority to U.S. Provisional patent application Ser. No. 62/622,675 filed on Jan. 26, 2018, which is incorporated by reference herein in its entirety.

BACKGROUND

The present disclosure relates to an interconnect for connecting conductive portions in electronic components, and in particular to, interconnects of one or more carbon nanofiber structures to connect conductive portions in the electronic components.

As pitch sizes of electronic devices have decreased, techniques involved in the development of such devices have also evolved in order to maintain their performance capability. However, with this increased performance, additional constraints on the electric power and thermal distribution of the semiconductor device have been discovered. As the system performance of a device increases, the density of the interconnect feature also increases, and, as a result, each interconnect feature is limited to usage at specific technology nodes in one particular semiconductor material.

More specifically, different device technologies may be associated with different connective properties which constrain the techniques which can be used in additive processing. For example, the connectivity of GaN devices to silicon technologies has thermal limits to incorporating one layer. GaN layers are generally deposited around a temperature of 1000° C., whereas silicon technologies often have a thermal limitation of approximately 400° C. As a result, conventionally, the two materials must be formed separately and joined together to form the final interconnect feature.

However, as the pitch, or size, of an interconnect feature decreases, conventional techniques are no longer as effective. For smaller interconnect features, adjoining materials requires a greater capacity for thermal expansion, which means with lower interconnect temperatures, additional bonding may be required for materials with lower bonding temperatures, further complicating the design process. Moreover, interconnect features of smaller pitch sizes will have different electrical characteristics than the same bulk material, for example a higher electrical resistance due to the reduced geometry of the material which causes a decrease in the electrical performance of the interconnect, for example the current carrying capacity. As a result, there exists a need for a technique for designing small interconnect features which accounts for technical considerations, such as thermal limitations and increased resistance readings.

SUMMARY

Embodiments relate to an interconnect feature that includes one or more carbon nanofiber structures, for forming conductive pathways between a first body and a second body. The first body has a surface with at least one nanoporous conductive structure protruding from the first surface. The second body has a surface comprising an array of nanofibers extending from its surface and penetrating into the corresponding conductive structures to form conductive pathways between the first body and the second body. In some embodiments, the first body is a driver chip and the second body is a substrate onto which the chip is mounted. Each carbon nanofiber is metallic such that the current carrying capacity of the interconnect feature is improved after penetrating the nanoporous conductive material. Due to their physical properties, each carbon nanofiber penetrates the nanoporous material when aligned and after the application of pressure.

When adjoined with the carbon nanofibers, the nanoporous conductive structures compress to a height that allows the tip of each carbon nanofiber to make contact with the first surface of the first body. By integrating an electrically conductive material into the conductive structures, the ampacity of the interconnect feature increases, therefore accommodating a larger current flow. In turn, the larger current flow offsets the increase in electrical resistance.

BRIEF DESCRIPTION OF DRAWINGS

Figure (FIG. 1A is a perspective view illustrating an array of carbon nanofibers (CNF) formed on a silicon substrate, according to an embodiment.

The figures depict various embodiments of the present disclosure for purposes of illustration only. One skilled in the art will readily recognize from the following discussion that alternative embodiments of the structures and methods illustrated herein may be employed without departing from the principles of the disclosure described herein.

DETAILED DESCRIPTION

Embodiments relate to an interconnect feature including carbon nanofiber structures extending from a body and nanoporous conductive structures on another body where the nanofiber structures penetrate the nanoporous conductive structures to form a connection. The interconnect feature formed in this matter accommodates a larger current flow through the interconnect feature. The nanofiber arrays may be formed of carbon nanofibers (CNF) and the conductive structures may be formed of nanoporous gold (NPG) structures.

As used herein, a body of the interconnect feature refers to an electrical component. In one implementation, one of the bodies may be a chip and the other body may be a substrate on which the chip is mounted.

Conductive Bodies of the Interconnect Feature

Figure 1A:
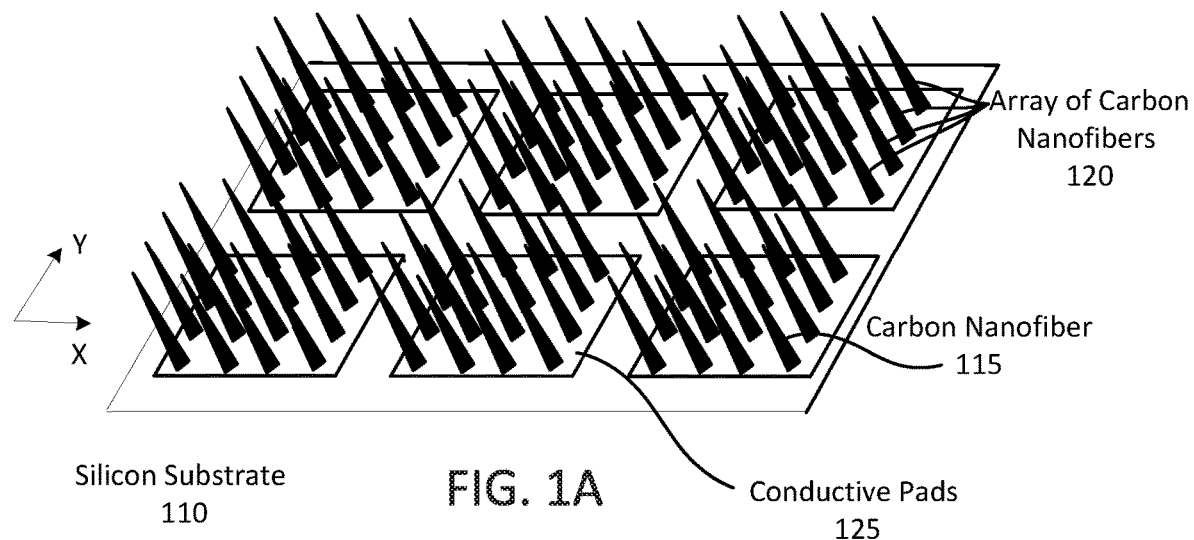
FIG. 1B is a perspective view illustrating an array of nanoporous metal structures positioned on a GaN chip, according to an embodiment.

FIG. 1A is a perspective view illustrating an array of carbon nanofibers (CNF) formed on a silicon substrate, according to an embodiment. As illustrated in FIG. 1A, the substrate 110 has multiple conductive pads 125, each aligned with other conductive pads 125 over the horizontal and vertical axis of the substrate 110. Grown on each conductive pad 125 is an array of CNFs 120 extending away from the surface of the conductive pads 125. In the illustrated embodiment of FIG. 1, each CNF is conically shaped such that the end connected to the conductive pad 125 is a wider than the end pointing away from the conductive pad 125 (e.g., a needle-like shape). In alternate implementations, the CNFs 115 may be shaped differently. Areas of the silicon substrate 110 other than the conductive pads 125 are not formed with the CNFs 120.

In some embodiments, CNFs 115 are structurally rigid (e.g., elastic modulus within the range of 25 to 48 GPa) compared to the nanoporous metals (e.g., elastic modulus of nanoporous gold is 2 GPa or lower) that form the nanoporous conductive structures mounted to the first body. As a result, the arrays of CNFs 120 are able to penetrate the nanoporous metal structures when aligned and pressured into contact. Compositionally, CNFs 115 may be metallic, rather than semi-conductive, to improve the conductivity of the interconnect feature. In some embodiments, the CNFs 115 are replaced with alternative structures, for example, carbon nanotubes (CNT), or carbon nano-spheres.

In one embodiment, the conductive pads 125 are placed in a regular pattern. In other embodiments, the conductive pads 125 are placed in an irregular pattern. The conductive pads 125 may all be of the same size and shape. Alternatively, the conductive pads 125 may be of different sizes and shapes. Furthermore, the number of CNFs 115 in each of the conductive pads 125 may be the same or different.

The CNF arrays 120 are grown on the surface of the body (e.g., silicon substrate 110 or another electrical component) at a temperature within the range of 350° C. to 400° C. In one embodiment, one or more carbon nanofibers are deposited on the surface of an electrical component (i.e., silicon substrate 110) using a plasma enhanced chemical vapor deposition process (PECVD). In alternate implementations, the carbon nanofibers are deposited using alternate growth techniques. During growth, individual CNFs are mounted to conductive pads 125 such that each conductive pad 125 corresponds to an array of CNFs 120. Within the above temperature range, CNFs 115 may be grown directly on the same surface of the body (i.e., the silicon substrate 110) as the conductive pads 125 which may be fabricated using a silicon complimentary metal-oxide semiconductor (CMOS) without causing physical damage to the driver chip or silicon substrate. Conventional techniques do not allow for the implementation of such high processing temperatures.

After CNFs 115 are grown, an average CNF 115 array may have an average diameter within the range of 50 nanometers, but not exceeding 1 micrometer. This range of diameters is advantageous, among other reasons, because, at this diameter, multiple CNFs 115 may be incorporated into the nanoporous metal structures mounted to the second body. Incorporating multiple carbon nanofibers into a single nanoporous metal structures improves the overall performance of the interconnect. Additionally, a CNF 115 may have a height within the range of 50 to 75 micrometers while maintaining its structural integrity. This range of heights is advantageous, among other reasons, because, within this range of heights, the interconnect feature may be designed at the same full height as the tallest carbon nanofiber such that the entire carbon nanofiber embeds into the corresponding nanoporous metal structure to allow connectivity between the first and second surface. In some embodiments, CNFs 115 may grow to a height within the range of 1 to 1.5 micrometers.

CNFs 115 in the array 120 may be spaced over the conductive pads 125 such that individual CNFs do not grow within a proximity of other fibers of the array. In one embodiment, each CNF 115 is positioned at the same distance in the X and Y directions away from adjacent CNFs. In one embodiment, a growth catalyst is applied to the surface of the body from which the CNFs extend, for example Fe, Ni, Co, to facilitate or expedite the growth of the CNF arrays 120. The growth catalyst may be applied at the tip of CNF 115 during growth. The growth catalyst may be incompatible with other surfaces or materials and accordingly may be removed prior to the adjoining of the CNFs 115 with a metallic conductor at a second substrate by using surface polishing techniques or by flycutting the surface using a tool, for example a diamond coated cutting tool.

Figure 1B:
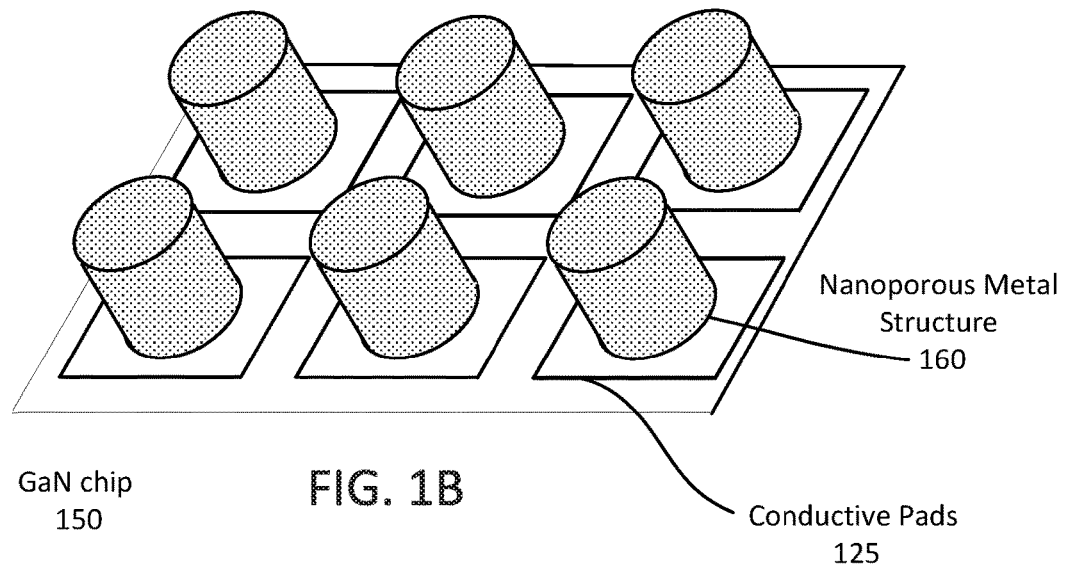

FIG. 1B is a perspective view illustrating an array of nanoporous metal structures on a GaN chip, according to an embodiment. As illustrated in FIG. 1B, the second body (i.e., GaN chip 150) has multiple conductive pads 125, each aligned with other conductive pads 125 of the chip 150 in X and Y direction. Mounted to each conductive pad 125 is a nanoporous metal structure 160 extending away from the surface of the conductive pads 125. In the illustrated embodiment of FIG. 1B, each nanoporous metal structure 160 is cylindrically shaped such that the areas of both the face mounted to the conductive pad 125 and the face extending away from the chip 150 are larger than the area of the corresponding array of CNFs 120 (i.e., when the silicon substrate 110 and the GaN chips 150 are adjoined, all of CNF 115 in the array 120 penetrate into the nanoporous metal structure 160).

GaN chip 150 is a substrate that mechanically supports and electrically couples the electronic components using conductive structures (e.g., nanoporous metal structures 160). The chip 150 may include circuits that are completed once one or more substrates 110 are placed onto the chip 150. In some embodiments, the chip 150 carries an amplified amount of current when the tips of the CNFs 115 penetrate the nanoporous metal structures 160 to make contact with the conductive pads 125 mounted to the chip 150.

In alternate embodiments, the nanoporous metal structures 160 may be shaped differently to accommodate an array of CNFs 120. The number of nanoporous metal structures 160 on a body (e.g., the GaN chip 150) is proportional to the number of arrays of CNFs 120 on the corresponding body (e.g., the silicon substrate 110) to which the former is adjoined. For example, the number of nanoporous metal structures 160 mounted to the GaN chip 150 is equivalent to the number of arrays of CNFs 120 such that each array 120 may adjoin with a nanoporous metal structure 160.

In embodiments in which the nanoporous metal structures 160 comprise nanoporous gold, the nanoporous gold structures are fabricated using selective dissolution (also known as dealloying). For example, the nanoporous gold structure 160 can be fabricated by dealloying Au-based alloy, e.g., Au—Ag alloy. Tertiary alloy compositions such as Au—Ag—Pt could also be employed. During the dealloying process, Ag is removed from the alloy in a strong corrosive environment, producing an open pore network structure that consists mostly of Au. Morphology of the nanoporous gold structure may be further modified by thermal treatment. For example, the nanoporous gold structure may be heated to increase the surface diffusion of gold atoms and resultantly increase average pore size. In addition or alternatively to nanoporous gold, the structures 160 may include one or more different type of nanoporous metal, for example, nanoporous silver, nanoporous copper, another single, binary, or tertiary metallic species, or some combination thereof. In some embodiments, the nanoporous conductive structures may be fabricated using a non-metal nanoporous material.

To prevent buckling or breaking of CNFs 115, the height of each nanoporous metal structure 160 may be greater than the height of the tallest CNF 115 in an array 120. When pressure is applied to adjoin an array of CNFs 120 to a nanoporous metal structure 160, the height of the each nanoporous metal structure decreases due to the compression of the nanoporous metal.

In alternative embodiments (not shown), both the CNFs 115 and the nanoporous metal structures are mounted to the same body of the interconnect feature, for example the silicon substrate 110 or the GaN chip 150, and the second body of the interconnect feature includes metal bond pads to which the nanoporous metal-CNF structures of the first body would couple to establish an electrical connection, for example a nanoporous gold or nanoporous copper bond bad would be implemented with nanoporous metal structures. The metal bond pads would be positioned on the second body in a uniform or non-uniform pattern depending on the positioned on the nanporous metal-CNF structures on the first body. In one embodiment, the number of metal bond pads on the second body is proportional to the number of nanoporous metal-CNF structures, for example a 1:1 ratio. To form the nanoporous metal-CNF structures, the techniques described above in reference to FIGS. 1A and 1B may be implemented such that the nanoporous metal structures are formed as coatings over the CNFs grown on the conductive pads of the first body. CNFs are grown on the body prior to the formation of the nanoporous metal structures on the same body. In one embodiment, the CNFs are grown on the surface of the first body and coated with the nanoporous metal before the second body is bonded to the first body. Using a thin metal coating to pre-plate the CNFs may be used to improve the overall performance of the interconnect feature.

Adjoining Carbon Nanofibers to Nanoporous Gold Structures

Figure 2A:
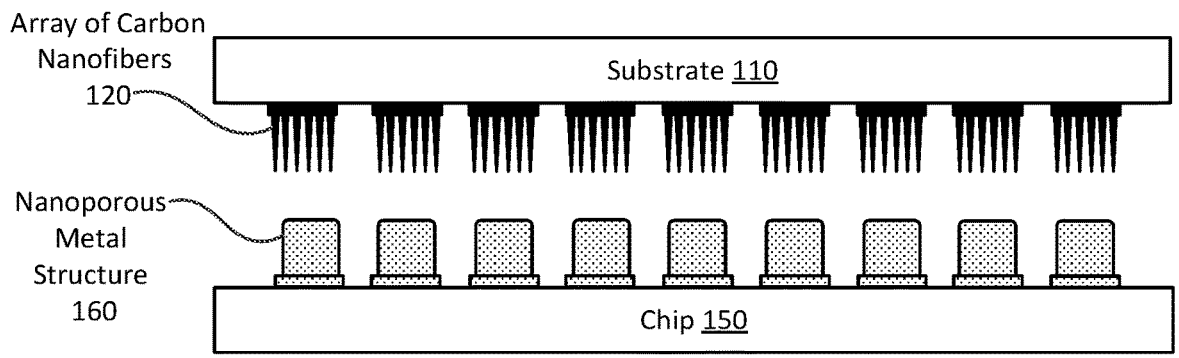
FIGS. 2A-2C are cross-sectional views illustrating a process of adjoining carbon nanofibers with nanoporous metal structures, according to an embodiment.
Figure 2B:
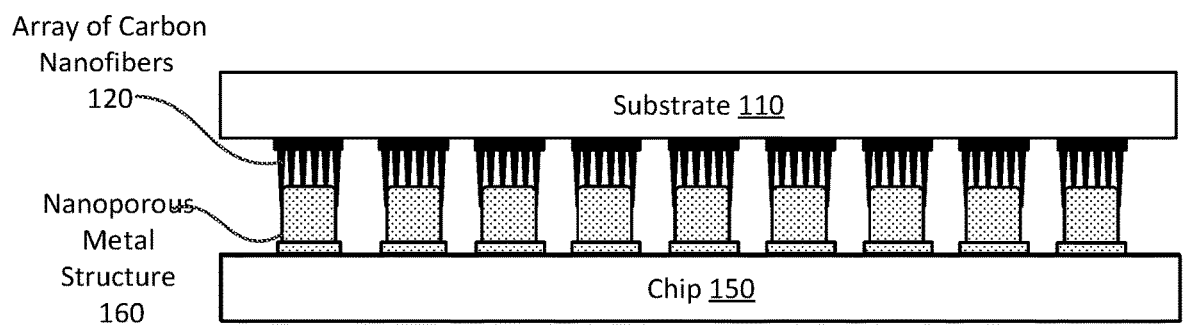
Figure 2C:
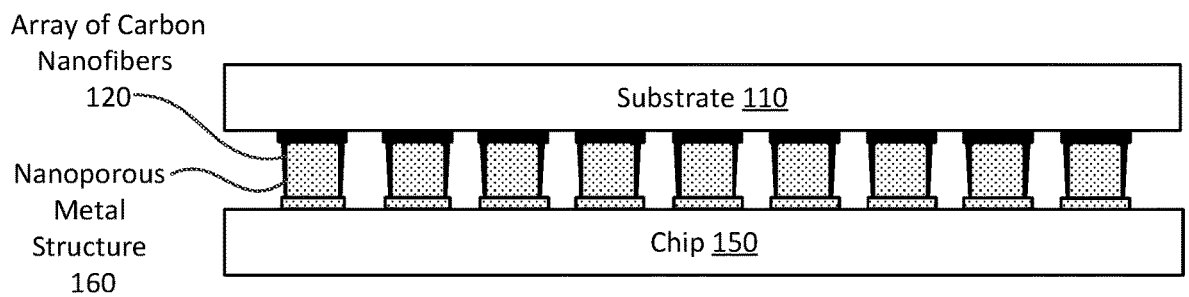

FIGS. 2A-2C are cross-sectional views illustrating a process of adjoining CNFs with nanoporous gold structures, according to an embodiment. FIG. 2A illustrates the initial positioning of substrate 110 and chip 150 prior to being adjoined, according to an embodiment. The nanoporous metal structures 160 and the array of CNFs 120 are not in contact, but are aligned such that if either surface were moved towards the other along a linear path, each array of CNFs 120 would make contact with a nanoporous metal structure 160. The movement of either the substrate 110 or the chip 150 to align the CNFs 120 and nanoporous metal structure 160 may be made, for example, by a mount 310, as described below with reference to FIG. 3.

FIG. 2B illustrates an updated position of the substrate 110 relative to the GaN chip 150 where the arrays of CNFs 120 are moved closer to the nanoporous metal structures 160, according to one embodiment. At the position illustrated in FIG. 2B, the tips of the CNFs 115 are at first contact with the nanoporous metal structures 160. At such a position, the nanoporous metal structures 160 individually begin to penetrate the corresponding nanoporous metal structures 160, and in the process, also compress the nanoporous metal structures 160.

FIG. 2C illustrates a completed example device including a substrate 110 connected to multiple arrays of CNFs 120 at conductive pads 125, according to one embodiment. The device may be for example, a micro light emitting diode (LED) assembly including a GaN chip 150. The substrate 110 may include a conductive trace and/or electrical circuit (not shown in FIG. 2A-C) to provide an electrical current to the GaN chip 150.

As illustrated, each CNF 115 is embedded into a nanoporous metal structure 160 to improve the electrical performance of the device. Due to their electrical conductivity properties, when in contact with each other, the arrays of CNFs 120 and nanoporous metal structures 160 compensate for the increased resistance of the interconnect feature by increasing the current carrying capacity of the interconnect feature.

In one or more embodiments, an adhesive underfill layer is applied at the junction between each CNF 115 and nanoporous metal structure 160 to improve the adhesion between the substrate 110 and the chip 150. The underfill layer may be applied after each CNF has been completely immersed in nanoporous metal structure 160. Alternatively or in addition, the underfill layer may be applied to surfaces of chip 150 and substrate 110 to form a partially cured adhesive that will become fully cured during the process of applying pressure and temperature to form the final junction between the nanoporous metal structures of the chip 150 and the CNFs of the substrate 110. In some embodiments, the two bodies may be applied with heat, for example by increasing the temperature, to enable the CNFs 115 to penetrate the nanoporous metal structures 160 with greater ease.

As described above in reference to FIG. 1B, before coupling an array of nanoporous metal structures 160 with an array of CNFs 120, the height of each nanoporous metal structure 160 is greater than that of the corresponding CNFs 120. After applying pressure to the side of the substrate 110 opposite the arrays of CNFs 120, the final height of the adjoined nanoporous metal CNF structure may be equal to the height of the tallest CNF 115 of the array 120. As a result, the extruding point of each CNF 115 makes contact with a conductive pad 125 mounted to the GaN chip 150 and the surface of the NPG structure 160 makes contact with the corresponding conductive pad 125 mounted to the substrate 110.

Although embodiments described above with reference to FIGS. 1A-2C have nanoporous metal structure 160 formed on the chip 150 and the array of CNFs 120 on the substrate 110, in other embodiments, the nanoporous metal structure can be formed on the substrate 110 and the CNFs 120 can be formed on the chip 150. In additional embodiments, the CNFs and the nanoporous metal structures can be formed at different locations of the substrate while corresponding nanoporous metal structures and CNFs can be formed on the chip.

Mechanism for Adjoining Carbon Nanofibers and Nanoporous Metal Structures

Figure 3:
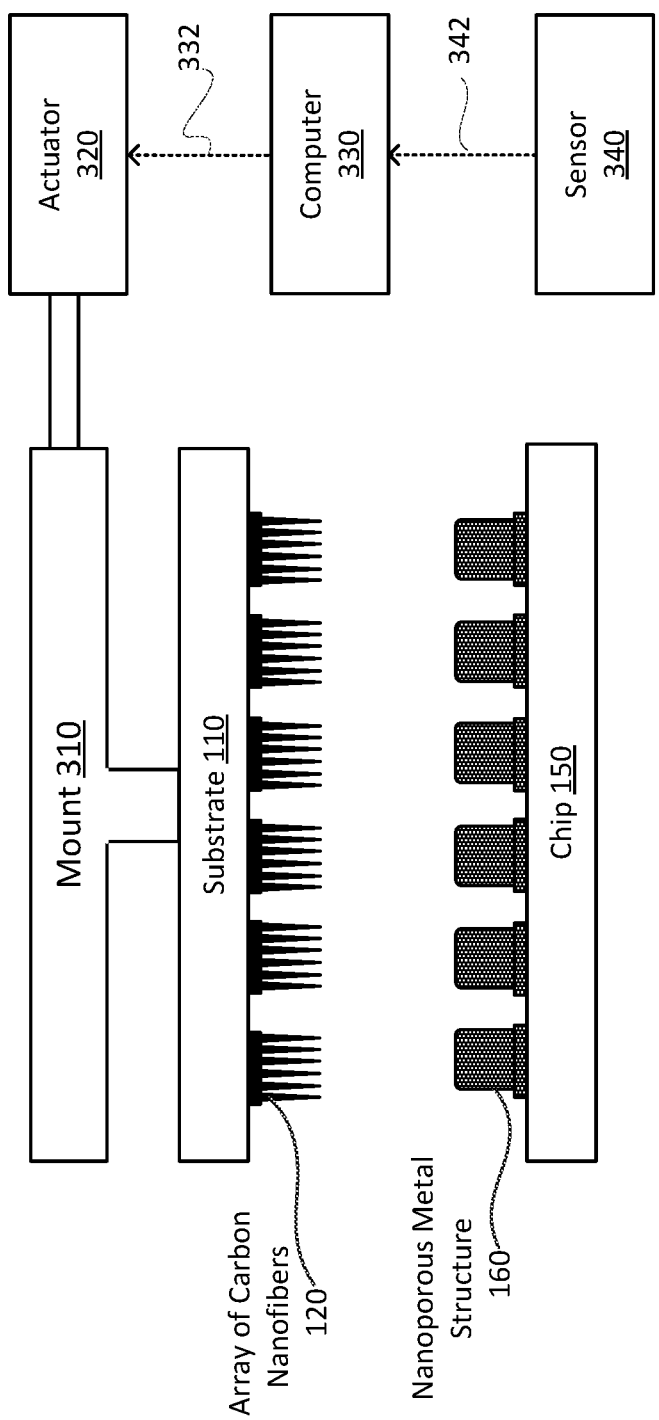
FIG. 3 is a block diagram illustrating components for adjoining carbon nanofibers with nanoporous metal structures, according to an embodiment.

FIG. 3 is a block diagram illustrating components for adjoining CNFs with nanoporous metal structures, according to an embodiment. The components include, among others, a mount 310, an actuator 320 operating the mount 310, a computer 330 and a sensor 340. The mount 310 is attached to the substrate 110 and places the substrate 110 onto the chip 150 by aligning the array of CNFs 120 of the substrate 110 with the nanoporous metal structures 160 of the GaN chip 150. If a voltage difference is applied between the CNFs 115 and if the substrate 110 is properly placed, the substrate 110 conducts current through nanoporous metal structures 160 to the chip 150. CNFs The sensor 340 detects the alignment of the chip 150 and the substrate 110 and may also detect the distance between the surface of the substrate 110 with the conductive pads 125 and the surface of the chip 150 with the nanoporous metal structures 160. The sensor 340 generates image signals that function as real time feedback to update the position of the substrate 110 during the coupling process. The sensor 340 sends measurement signals 342 to the computer 330. Although only a single sensor 340 is illustrated in FIG. 3, multiple sensors can be used to detect the alignment and the distance between the substrate 110 and the chip 150.

The sensor 340 may be an image capturing device that captures the images of the substrate 110 to determine whether the tips of each CNF 115 have made contact with the conductive pads 125 of the chip 150. In alternative embodiments, the sensor 340 may detect a distance between interior facing surface of the substrate 110 and the interior facing surface of the chip 150. As the actuator moves the substrate 110 closer to the chip 150, the sensor 340 periodically updates the spatial measurement until the measurement is within a threshold distance. After detecting a threshold distance, the sensor 340 may cause the actuator 320 to stop the movement of the mount 310.

Using the measurement signals 342, the computer 330 sends control signals 332 to the actuator 320. The actuator 320 is attached to the mount 310 and provides instructions for the mount 310 to apply pressure to exterior facing surface of the substrate 110 such that the arrays of CNFs 120 move closer to the NPG structures 160.

The mount 310 moves the substrate 110 according to the movement of the actuator 320 to place the substrate 110 onto the chip 150. The mount 310 can support any number of substrates 110 and can place multiple substrates onto the chip 150 at once. In some embodiments, the sensor 340 is placed on top of the mount 310 that is transparent to allow the sensor 340 to capture alignment of the array of CNFs 120 and the NPG structures 160.

The actuator 320 is coupled to the mount 310 and controls movement of the mount 310. By moving the mount 310, the actuator 120 aligns the mount 310 and the substrate 110 with the chip 150 by aligning the arrays of CNFs 120 with the nanoporous metal structures 160. In some embodiments, the actuator 320 is a multiple degree of freedom actuator, such as an actuator that is configured to move the mount 310 up and down, left and right, forward and back. The actuator 320 may also adjust yaw, tilt, or rotate the mount 310. In some embodiments, multiple actuators 320 couple to multiple mounts 319 to perform substrate 110 position tasks in parallel to increased throughput.

The computer 330 controls the overall operation of joining the substrate 110 and the chip 150. For this purpose, the computer 330 provides control signals 332 to the actuator 320 and receives the measurement signals 342 received from the sensor 340. The computer 330 is further described with reference to FIGS. 4-5.

In some embodiments, the apparatus comprises a heat plate (not shown in FIG. 3) capable of controlling the temperature of the chip 150 by heating or cooling the substrate 110. This may be advantageous for bonding the arrays of CNFs 120 to the nanoporous metal structures 160.

Figure 4:
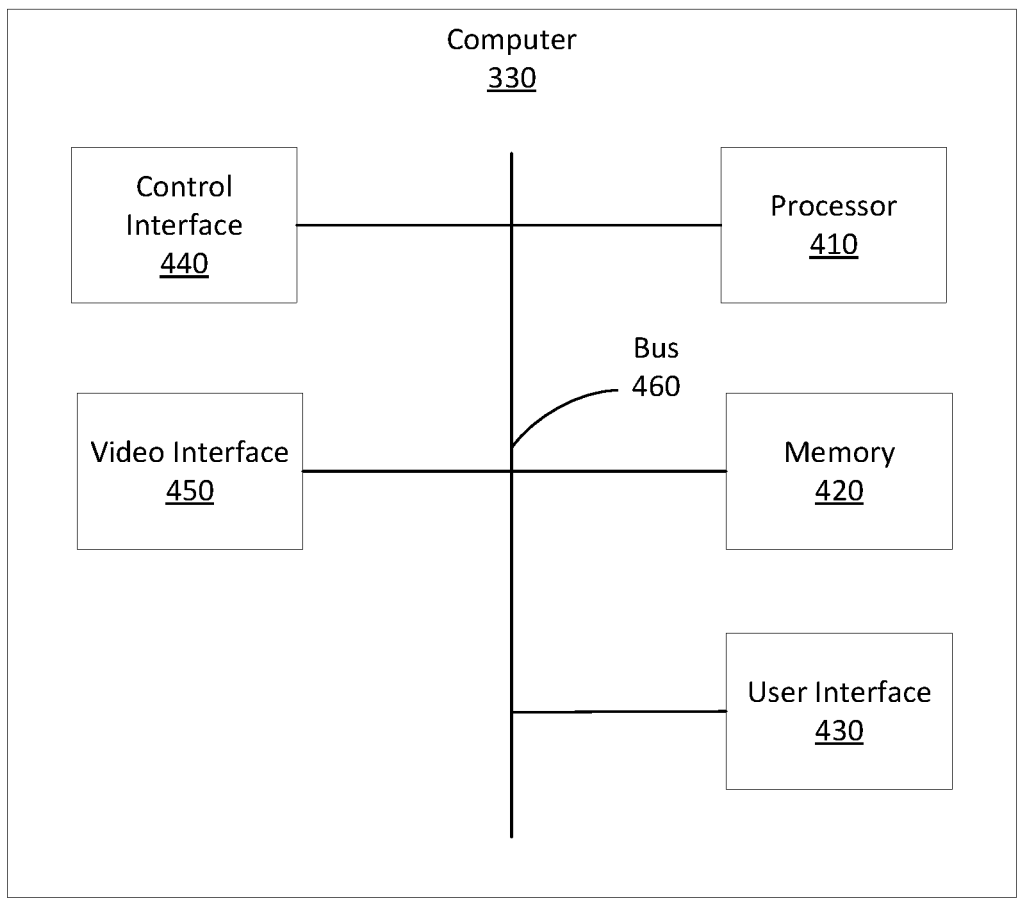
FIG. 4 is a block diagram of a computer communicatively coupled to a mount for performing the operation of adjoining the carbon nanofibers with nanoporous metal structures, according to an embodiment.

FIG. 4 is a block diagram of the computer 330 for performing the operation of adjoining the CNFs with nanoporous metal structures, according to an embodiment. The computer 330 may include, among other components, a processor 410, a memory 420, a user interface 430, a control interface 440, a video interface 450 and a bus 460 connecting these components. Some embodiments of the computer 330 have different and/or other components than those shown in FIG. 2.

The computer 330 may be a personal computer (PC), a video game console, a tablet PC, a smartphone, or any machine capable of executing instructions (sequential or otherwise) that specify actions to be taken by that device. The computer 330 can operate as a standalone device or a connected (e.g., networked) device that connects to other machines. Furthermore, while only a single device is illustrated, the term "device" shall also be taken to include any collection of devices that individually or jointly execute instructions to perform any one or more of the methodologies discussed herein.

The processor 410 is a processing circuitry configured to carry out instructions stored in the memory 420. For example, the processor 410 can be a central processing unit (CPU) and/or a graphics processing unit (GPU). The processor 410 may be a general-purpose or embedded processor using any of a variety of instruction set architectures (ISAs). Although a single processor 410 is illustrated in FIG. 4, the computer 330 may include multiple processors 410.

The memory 420 is a non-transitory machine-readable medium which stores data and instructions (e.g., software) embodying any one or more of the methodologies or functions described herein. For example, the memory 420 may store instructions which when executed by the processor 410 configure the processor 410 to perform the method, described below in detail with reference to FIG. 6. Instructions may also reside, completely or at least partially, within the processor 410 (e.g., within the processor's cache memory) during execution thereof by the computer 330.

The user interface 430 is hardware, software, firmware, or a combination thereof that enables a user to interact with the computer 330. The user interface 430 can include an alphanumeric input device (e.g., a keyboard) and a cursor control device (e.g., a mouse, a trackball, a joystick, a motion sensor, or other pointing instrument). For example, a user uses a keyboard and mouse to select position parameters for position a substrate 110 on the chip 150.

The control interface 440 transmits control signals to the actuator 320. For example, the control interface 440 is a circuit or a combination of circuits and software that interfaces with the actuator 320 to transmit the control signals.

The video interface 450 is a circuit or a combination of circuit and software that receives image data via the measurement signals from the sensor 340 and transfers the image data to the memory 420 and/or processor 410 to be stored and processed.

The computer 330 executes computer program modules for providing functionality described herein. As used herein, the term "module" refers to computer program instructions and/or other logic used to provide the specified functionality. Thus, a module can be implemented in hardware, firmware, and/or software. In some embodiments, program modules formed of executable computer program instructions are loaded into the memory 420, and executed by the processor 410. For example, program instructions for the method of FIG. 6 described herein can be loaded into the memory 420, and executed by the processor 410.

Figure 5:
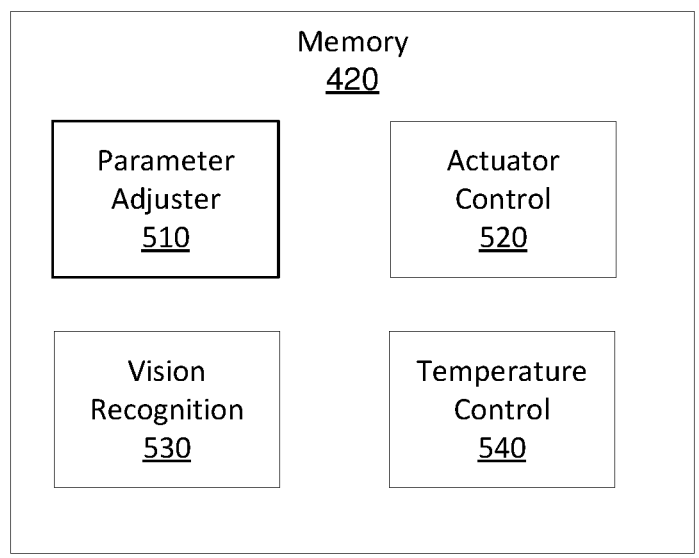
FIG. 5 is a block diagram of software modules in the memory of the computer, according to an embodiment.

FIG. 5 is a block diagram of software modules in the memory of the computer, according to one embodiment. The memory 420 may store, among other modules, an actuator control module 302, a temperature control module 304, a vision recognition module 306, and a parameter adjuster module 308. The memory 204 may include other modules not illustrated in FIG. 3.

The parameter adjuster module 510 provides instructions for monitoring the position parameters and adjusting them in real time as needed. The parameter adjuster module 510 can adjust the position parameters in response to one or more substrates 110 failing under a position criteria. The parameter adjuster module 510 may determine which parameters to adjust based on the failed criteria. For example, if substrate 110 is incorrectly placed on the chip 150 (e.g., between nanoporous metal structures 160), the position location can be adjusted. In another example, if the substrate 110 moves after being positioned (this may indicate that the CNFs 115 did not properly bond to the nanoporous metal structures 120), the position time and pressure may be adjusted. The adjusted parameters can be temporarily adjusted for the substrate 110 currently being placed or permanently adjusted for the current and future position of substrate 110. The parameter adjuster module 510 can continually adjust the position parameters until one or more emitting states satisfy the criteria. This can allow for optimizing the position parameters of the position process and allow insight into root causes of failed substrate 110 position.

The actuator control module 520 provides instructions for generating control signals to control the actuator 320 to adjust one or more position parameters. The position parameters relate to the positions of one or more substrates 110 on the chip 150. The position parameters include a position location, a position angle, a position pressure, a position temperature, and a position time. The position location is the location of the substrate 110 relative to the chip 150. The position angle is the angle of the substrate 110 relative to the chip 150 and, more specifically, the angle of the CNFs 115 relative to the nanoporous metal structures 160. The position pressure is the pressure applied to the substrate 110 by the mount 310 once it is placed on the chip 150. The position time is the amount of time that the position pressure and the position temperature are applied to the substrate 110. The position temperature is the temperature of the chip 150 or a temperature change of the chip 150 during the position of the substrate 110.

The vision recognition module 530 performs analysis on the measurement data to measurement signals to determine the position of the substrate 110. Specifically, the vision recognition module 530 determines whether the position of the substrate 110 fails one or more criteria. The criteria form a standard for determining proper position of one or more substrates 110. The position of the substrate 110 may fail under the criteria for any number of reasons, such as, for example, a substrate 110 is placed at an incorrect position location, position angle, position time, position pressure, position temperature, etc.

The temperature control module 540 sets the position temperature by controlling the temperature, for example using a heat plate. In some embodiments, the position parameters also include heating ramp shape, underfill or flux behavior, the influence of lateral movements (e.g. caused by thermal expansion) on position formation, the influence of metal oxides, allowable pressure range, and allowable temperature range.

Process for Adjoining Carbon Nanofibers and Nanoporous Metal Structures

Figure 6:
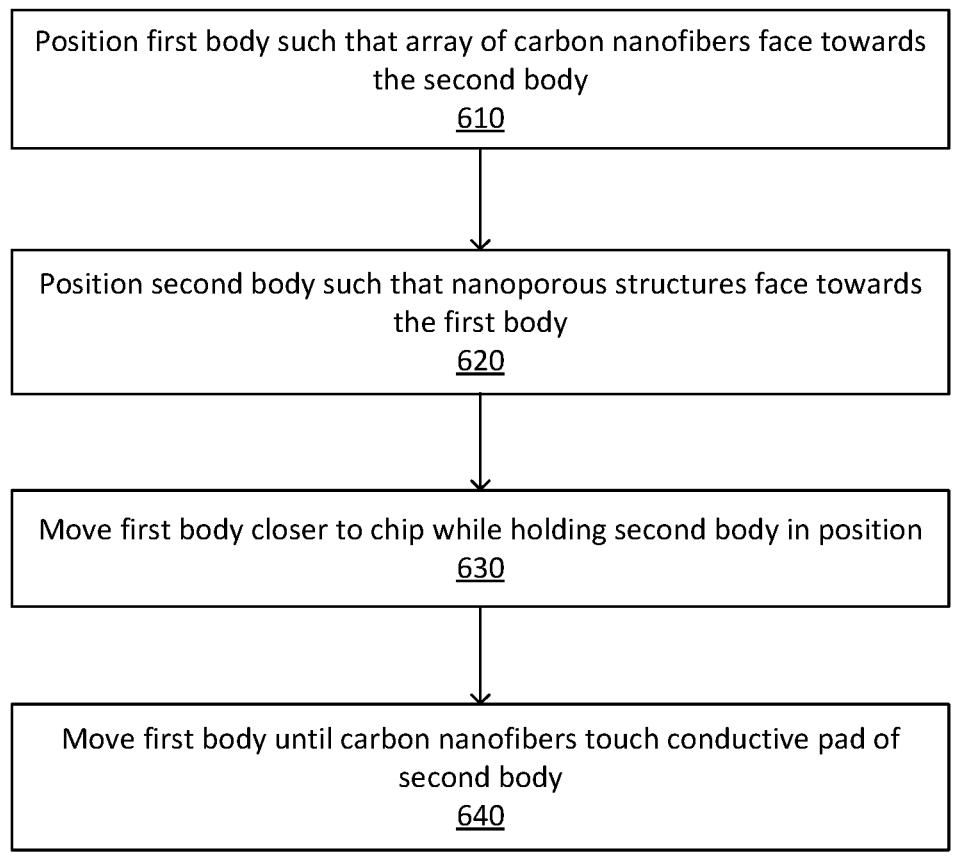
FIG. 6 is a flow chart describing the process for adjoining carbon nanofibers with nanoporous metal structures, according to an embodiment.

FIG. 6 is a flow chart describing the process for adjoining CNFs with nanoporous metal structures, according to an embodiment. The process may include different or additional steps than those described in conjunction with FIG. 5 in some embodiments or perform steps in different orders than the order described in conjunction with FIG. 5.

As illustrated in FIGS. 2A-2C and 3, the first body of the interconnect feature (i.e., substrate 110) on which the arrays of CNFs 120 are grown is positioned 610 such that the arrays of CNFs 120 are oriented towards a second body to which the nanoporous metal structures are mounted (i.e., GaN chip 150). The second body is positioned 620 such that one or more nanoporous metal structures 160 are oriented towards the first body. The position of the first body is moved 630 such that the distance between the two bodies decreases. Accordingly, as the first body moves closer to the second body, the tips of the arrays of CNFs 120 come in contact with the opposing nanoporous metal structures 160. In one embodiment, the body to which the array of nanoporous metal structures are mounted is held at a fixed position relative to the movement of the other body. In an alternate embodiment, the body including the nanoporous metal structures is also adjusted by a second actuator while the position of the other body is simultaneously adjusted by the first actuator. The position of the body on which the CNFs 115 are grown is moved 640 until the CNFs 115 make contract with the conductive pads mounted to the other body.

In some embodiments, the arrays of CNFs 120 and the nanoporous metal structures are mounted to the opposite bodies of the interconnect feature compared to the above description, for example the arrays of CNFs 120 grown on the GaN chip 150 and the nanoporous metal structures 160 grown on the substrate 110. In additional embodiments, the actuator may adjust the position of the body to which the nanoporous metal structures are mounted while holding the body on which the CNFs are grown at a fixed position. Regardless of the orientation of the nanoporous metal structures and the CNFs or the surface adjusted by the actuator, the device created by coupling a nanoporous metal structure 160 and an array of CNFs 120 is consistent with the above description. Additionally, the GaN chip 150 may be replaced with an alternate electronic element, for example an LED.

While particular embodiments and applications have been illustrated and described, it is to be understood that the invention is not limited to the precise construction and components disclosed herein and that various modifications, changes and variations which will be apparent to those skilled in the art may be made in the arrangement, operation and details of the method and apparatus disclosed herein without departing from the spirit and scope of the present disclosure.

What is claimed is:

1. A device comprising:
    a first body comprising a first surface with nanoporous conductive structures protruding from the first surface; and
    a second body comprising a second surface with an array of nanofibers extending from the second surface and penetrating into corresponding nanoporous conductive structures to form conductive pathways between the first body and the second body.

2. The device of claim 1, wherein the array of nanofibers penetrate the corresponding nanoporous conductive structures such that a point of each nanofiber of the array of nanofibers contacts a conductive pad mounted between the nanoporous conductive structures and the first surface.

3. The device of claim 1, wherein the second body further comprises:
    a growth catalyst applied to the second body, wherein the growth catalyst comprises one of iron, nickel, or cobalt; and
    a metallic conductor enabling the second body to adjoin to an additional material.

4. The device of claim 1, wherein the nanoporous conductive structures protruding from the first surface comprise nanoporous gold structures.

5. The device of claim 4, wherein the nanoporous gold structures have an elastic modulus of 2 GPa.

6. The device of claim 1, wherein the array of nanofibers extending from the second surface comprise carbon nanofibers.

7. The device of claim 6, wherein the carbon nanofibers have an elastic modulus of 25 GPa to 48 GPa.

8. The device of claim 6, wherein the carbon nanofibers have a maximum diameter of 50 nanometers and a height within the range 50 micrometers to 75 micrometers.

9. A method comprising:
aligning a first body and a second body, the first body comprising a first surface with nanoporous conductive structures protruding from the first surface, and the second body comprising a second surface with an array of nanofibers extending from the second surface; and
approaching the first body and the second body to have the array of nanofibers of the second surface penetrate into corresponding nanoporous conductive structures on the first surface of the first body to form conductive pathways between the first body and the second body.

10. The method of claim 9, wherein approaching the first body and the second body to have the array of nanofibers of the second surface penetrate into corresponding nanoporous conductive structures on the first surface of the first body comprises positioning a point of each nanofiber of the array of nanofibers to make contact with a conductive pad mounted between the nanoporous gold structures and the first surface.

11. The method of claim 9, wherein the second body further comprises:
a growth catalyst applied to the second body, wherein the growth catalyst comprises one of iron, nickel, or cobalt; and
a metallic conductor enabling the second body to adjoin to an additional material.

12. The device of claim 9, wherein the nanoporous conductive structures protruding from the first surface comprise nanoporous gold structures.

13. The device of claim 12, wherein the nanoporous gold structures have an elastic modulus of 2 GPa.

14. The device of claim 12, wherein the array of nanofibers extending from the second surface comprise carbon nanofibers.

15. The device of claim 14, wherein the carbon nanofibers have an elastic modulus of 25 GPa to 48 GPa.

16. The device of claim 14, wherein the carbon nanofibers have a maximum diameter of 50 nanometers, and a height within the range 50 micrometers to 75 micrometers.

17. A non-transitory computer readable medium storing instructions comprising:
aligning a first body and a second body, the first body comprising a first surface with nanoporous conductive structures protruding from the first surface, and the second body comprising a second surface with an array of nanofibers extending from the second surface; and
approaching the first body and the second body to have the array of nanofibers of the second surface penetrate into corresponding nanoporous conductive structures on the first surface of the first body to form conductive pathways between the first body and the second body.

18. The non-transitory computer readable medium of claim 17, wherein approaching the first body and the second body to have the array of nanofibers of the second surface penetrate into corresponding nanoporous conductive structures on the first surface of the first body comprises positioning a point of each nanofiber of the array of nanofibers to make contact with a bond pad mounted between the nanoporous gold structures and the first surface.

19. The non-transitory computer readable medium of claim 17, wherein the nanoporous conductive structures protruding from the first surface comprise nanoporous gold structures.

20. The device of non-transitory computer readable medium claim 17, wherein the array of nanofibers extending from the second surface comprise carbon nanofibers.

* * * * *